US010132663B2

(12) United States Patent
Ronning et al.

(10) Patent No.: US 10,132,663 B2
(45) Date of Patent: Nov. 20, 2018

(54) SELF-CALIBRATING LINEAR VOLTAGE DIFFERENTIAL TRANSFORMER DEMODULATOR

(71) Applicant: Goodrich Corporation, Charlotte, NC (US)

(72) Inventors: Eric Duane Ronning, Glendale, AZ (US); Natraj Ninjuri, Bangalore (IN); Kalluri Rao, Bangalore (IN)

(73) Assignees: GOODRICH CORPORATION, Charlotte, NC (US); GOODRICH AEROSPACE SERVICES PRIVATE LIMITED, Bangalore, Karnataka (IN)

( * ) Notice: Subject to any disclaimer, the term of this patent is extended or adjusted under 35 U.S.C. 154(b) by 228 days.

(21) Appl. No.: 14/700,582

(22) Filed: Apr. 30, 2015

(65) Prior Publication Data
US 2016/0320217 A1    Nov. 3, 2016

(51) Int. Cl.
*G01R 35/00* (2006.01)
*G01D 18/00* (2006.01)
*G01D 5/22* (2006.01)
*G01R 33/00* (2006.01)
*G01D 5/20* (2006.01)

(52) U.S. Cl.
CPC ............ *G01D 18/00* (2013.01); *G01D 5/20* (2013.01); *G01D 5/2291* (2013.01); *G01R 33/0017* (2013.01); *G01R 33/0035* (2013.01); *G05B 2219/37124* (2013.01); *G05B 2219/37185* (2013.01)

(58) Field of Classification Search
CPC ............ G01R 33/0017; G01R 33/0035; G05B 2219/37124; G05B 2219/37185; G05G 2009/04755

USPC .................. 324/51, 55, 74, 130, 200, 202
See application file for complete search history.

(56) References Cited

U.S. PATENT DOCUMENTS

| 2,232,792 | A | * | 2/1941 | Levin | ............ G01R 27/02 324/651 |
| 5,180,979 | A | | 1/1993 | Frazzini et al. | |
| 5,767,670 | A | | 6/1998 | Maher et al. | |
| 6,295,015 | B1 | * | 9/2001 | Jones | ............ G06F 1/0321 329/318 |

(Continued)

FOREIGN PATENT DOCUMENTS

EP    0646774 A2    4/1995
EP    0768515 A1    4/1997

OTHER PUBLICATIONS

European Search Report for EP Application No. 16167983.2 dated Oct. 18, 2016; 7 pages.

*Primary Examiner* — Huy Q Phan
*Assistant Examiner* — Raul Rios Russo
(74) *Attorney, Agent, or Firm* — Cantor Colburn LLP

(57) ABSTRACT

A calibration system includes an excitation module that introduces an excitation signal to a primary coil of a differential transformer, a measurement module that measures, at a first phase shift, a positive value of an induced signal. The induced signal is caused by the excitation signal on a secondary coil of the differential transformer. The system further includes a calculation module that compares the positive value to a last positive value to form a compared positive value, and a calibration module that changes the first phase shift based on the compared positive value.

2 Claims, 4 Drawing Sheets

(56) References Cited

U.S. PATENT DOCUMENTS

| | | | | |
|---|---|---|---|---|
| 2001/0054312 | A1* | 12/2001 | Czarnek | G01D 5/2046 73/313 |
| 2002/0071298 | A1* | 6/2002 | Pennell | H04R 1/00 363/67 |
| 2003/0141917 | A1* | 7/2003 | McBrien | G01D 5/2266 327/304 |
| 2005/0288884 | A1* | 12/2005 | Sutrave | G01R 35/00 702/106 |
| 2006/0119351 | A1* | 6/2006 | James | G01D 5/204 324/207.17 |
| 2007/0024274 | A1* | 2/2007 | Riedel | G01D 5/2291 324/207.18 |
| 2007/0069937 | A1* | 3/2007 | Balakrishnan | H03M 1/0624 341/161 |
| 2009/0058379 | A1* | 3/2009 | Sreenivas | H02M 3/1584 323/241 |
| 2009/0086830 | A1* | 4/2009 | Buisson | G01D 5/2266 375/258 |
| 2013/0328516 | A1* | 12/2013 | Prussmeier | G01D 5/2046 318/656 |
| 2014/0232575 | A1* | 8/2014 | Le Dortz | H03M 1/0624 341/118 |
| 2014/0253054 | A1* | 9/2014 | Frampton | H02P 9/14 322/28 |
| 2015/0035519 | A1* | 2/2015 | Buelau | G01D 5/2291 324/207.18 |

* cited by examiner

SELF-CALIBRATING LINEAR VOLTAGE DIFFERENTIAL TRANSFORMER DEMODULATOR

FIELD OF THE INVENTION

The subject matter disclosed herein relates to aircraft actuation systems, and in particular to a self-calibrating linear voltage differential transformer demodulator.

BACKGROUND

A linear voltage differential transformer position sensor can sense a position of a shaft disposed between a primary winding and secondary windings of the transformer. An excitation signal is applied to the primary winding, and the excitation signal is coupled to the secondary windings. The resulting voltages across the secondary windings can be used to calculate shaft position. One technique to measure the secondary voltages involves calculating the RMS or average value across each secondary winding in response to the excitation signal applied to the primary winding. This method requires collecting several samples during the period of the excitation frequency. Moreover, if the excitation waveform has distortion from an ideal sine wave, the measurement will require many samples to measure the magnitude correctly.

Another measurement technique is to sample twice per cycle, once at the positive peak and once at the negative peak of each of the secondary induced signals, taking the difference between the two measurements. The challenge of this peak-to-peak measurement is to find the peaks of the secondary waveform. There is a phase shift between the excitation voltage of the primary winding and the secondary windings. This phase shift changes as a function of the temperature, aging, interconnect wiring etc., making determination of the peak-to-peak measurement difficult.

BRIEF DESCRIPTION OF THE INVENTION

In one aspect, a calibration system comprises an excitation module that introduces an excitation signal to a primary coil of a differential transformer, a measurement module that measures, at a first phase shift, a positive value of an induced signal, the induced signal is caused by the excitation signal on a secondary coil of the differential transformer, a calculation module that compares the positive value to a last positive value to form a compared positive value; and a calibration module that changes the first phase shift based on the compared positive value.

In another aspect, a calibration method comprises introducing an excitation signal to a primary coil of a differential transformer, measuring, at a first phase shift, a positive value of an induced signal, the induced signal is caused by the excitation signal on a secondary coil of the differential transformer, comparing the positive value to a last positive value; and changing the first phase shift based on the compared positive value.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
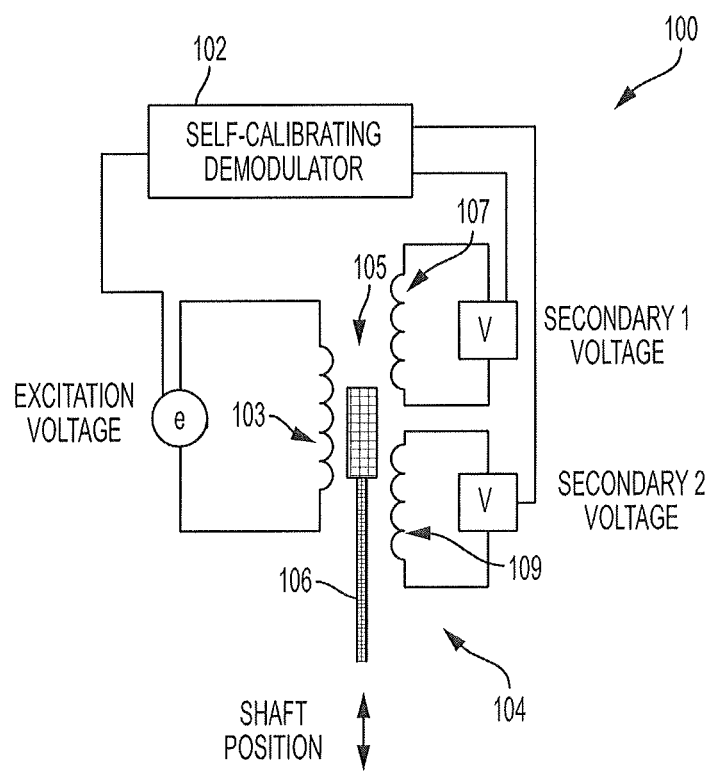
FIG. 1 is an illustration of a linear voltage differential transformer position sensor including a self-calibrating demodulator in accordance with one embodiment of the invention.

FIG. 1 illustrates a view of a position sensor 100 including a self-calibrating demodulator 102 of the subject invention. The position sensor 100 includes a linear voltage differential transformer (LVDT) 104. The position sensor 100 measures a relative position of a movable shaft 106 located between a primary winding 103 and the secondary windings 105 of the LVDT. The voltages across the secondary windings 105 are used to determine the position of the movable shaft 106. The position of the movable shaft 106 is calculated based on ratio of the peak-to-peak voltages of the secondary windings 105. Specifically, the following formula can be used to calculate relative position of the movable shaft 106:

$$P = \frac{(Vsec1 - Vsec2)}{(Vsec1 + Vsec2)}$$

In the above equation, P is the relative position, Vsec1 is a first voltage across the first secondary winding 107, and Vsec2 is a second voltage across the second secondary winding 109. For accuracy, it may be desirable to represent Vsec1 and Vec2 as peak-to-peak values instead of a root mean square or average value. Due to environmental factors, aging, etc., the secondary windings may have differing phase shifts, making the determination of peak-to-peak values difficult. As described in more detail below, the self-calibrating demodulator 102 includes a calibration system to facilitate the detection of peak-to-peak values without high-frequency sampling of an excitation signal coupled by the secondary windings. The calibration system can analyze the coupled waveforms on the secondary windings to track the peak of each coupled waveform.

Figure 2:
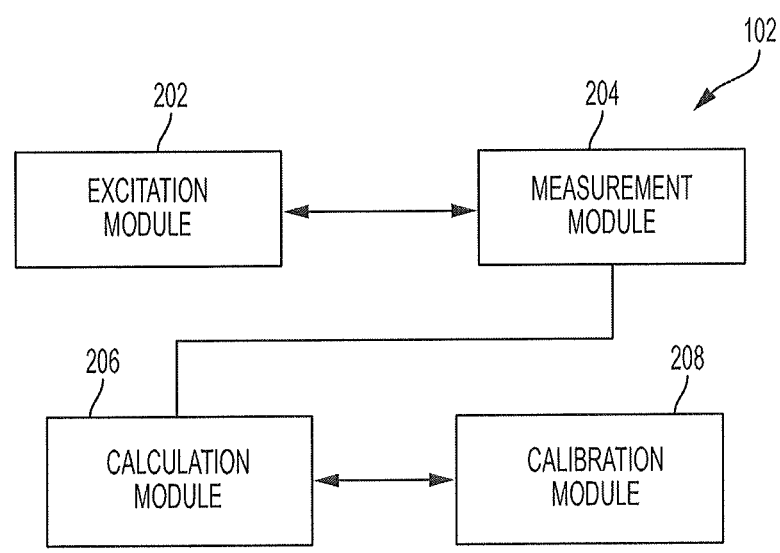
FIG. 2 is a block diagram of the self-calibrating demodulator in accordance with one embodiment of the subject invention.

FIG. 2 illustrates a block diagram of the self-calibrating demodulator 106 in accordance with one embodiment of the invention. The self-calibrating demodulator may include one or more modules or datastores. As used herein, the terms module and sub-module refer to an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the modules shown in FIG. 2 can be combined and/or further partitioned.

Furthermore, although the self-calibrating demodulator 102 is shown in connection with an LVDT 104, the demodulator 102 can be applied to any non-contact sensor including a RVDT, resolver, LVT, etc.

In FIG. 2, with continuing reference to FIG. 1, the demodulator 102 includes an excitation module 202. The excitation module 202 introduces an excitation signal and provides enable pulses to the primary coil of the LVDT. The excitation signal can be in the form of a sinusoidal signal with a known period, but other types of excitation signals can be generated by the excitation module 202.

The excitation module 202 is in communication with a measurement module 204. The generation of the excitation signal by the excitation module 202 triggers the measurement module 204. The measurement module 204 measures a positive sampled value of the induced signal at a first phase (i.e. 50 degrees) that is delayed from the excitation signal. The first phase depends on the LVDT electrical characteristics. As described below, the first phase value can incrementally change to obtain a larger positive sampled value. The positive sampled value can represent a sample along a positive amplitude of the induced signal.

A calculation module 206 communicates with the measurement module 204. The calculation module compares the positive sampled value to the last positive sampled value obtained by the measurement module. For example, previous positive sampled values may be averaged or stored in a memory of the calculation module 206. Initially, a previous positive sampled value can be a set initial value.

A calibration module 208 communicates with the calculation module 206 and the measurement module. Based on whether the positive sampled value is greater or lower than the last positive sampled value stored in memory, the first phase is incrementally increased or incrementally decreased by the calibration module 208 until a peak positive sampled value is obtained. In one embodiment, the first phase is increased or decreased within certain upper and lower limits. The upper and lower limits may define a window in which a positive peak of the waveform may occur, thereby reducing sampling time. The peak positive sampled value represents the positive amplitude of the induced signal on a secondary winding.

The measurement module 204 can also measure a negative sampled value of the induced signal, measured at a second phase (i.e. 230 degrees). The second phase also depends on the LVDT electrical characteristics. Similarly, the measurement module 204 may have limits for the upper and lower values of the second phase. The second phase is shifted from the first phase by 180 degrees, allowing for the measurement of a negative sampled value.

The calculation module 206 also compares the negative sampled value to the last negative sampled value obtained, to form a compared negative value. Based on whether the negative sampled value is greater or lower than the last negative sampled value, the second phase is incrementally increased or incrementally decreased by the calibration module 208 until a peak negative sampled value is obtained.

The positive sampled value and the negative sampled value are obtained once per period of the induced signal. Once the peak positive sampled value and the peak negative sampled values are obtained, the calculation module 206 can determine a peak-to-peak value on the secondary winding. It is appreciated that the self-calibrating demodulator 102 may have multiple of the above-mentioned modules operating in parallel, so that peak-to-peak values may be calculated for each secondary winding simultaneously. The peak-to-peak values of the secondary windings can be used by the calculation module to calculate position of a movable shaft, for example.

Accordingly, a peak-to-peak value of the induced signal is obtained without a high-bandwidth sampling technique, reducing computational requirements while increasing the accuracy of the relative shaft position measurement.

Figure 3:
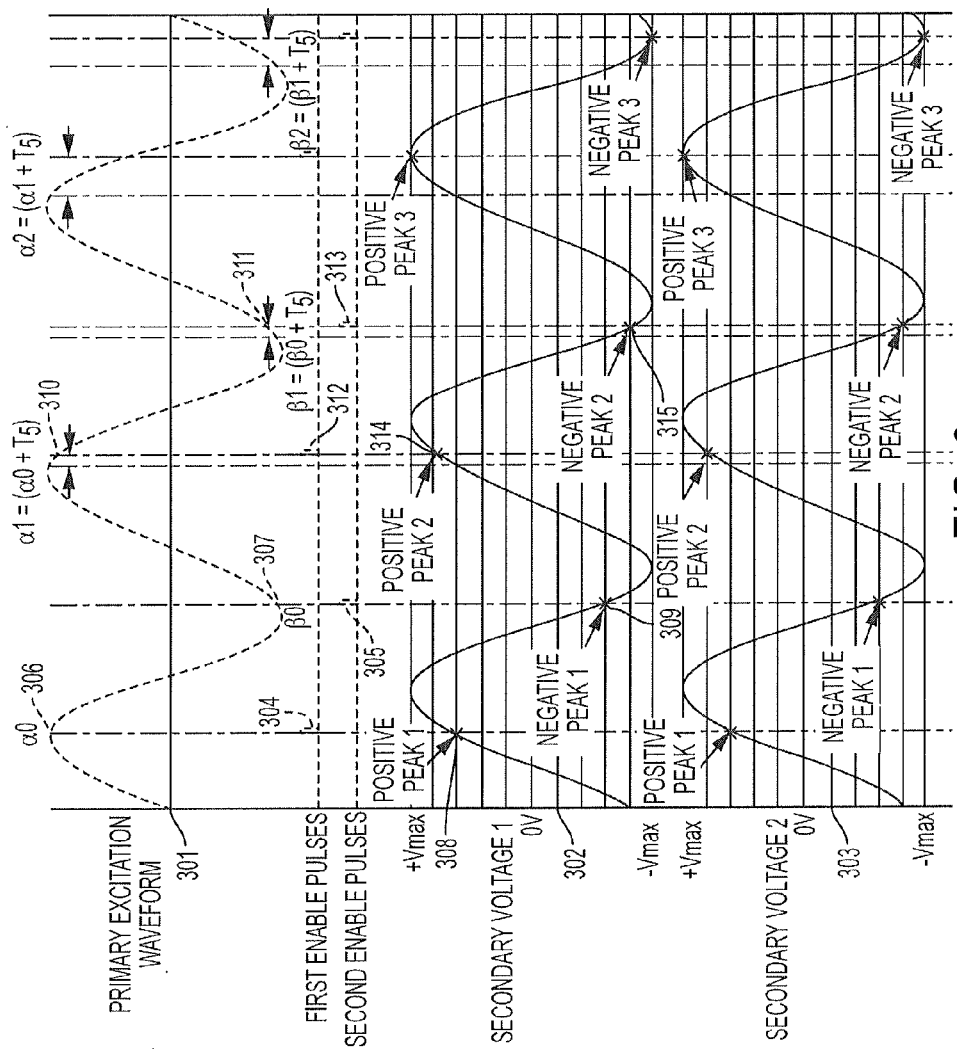
FIG. 3 is an illustration of a primary excitation waveform and corresponding secondary voltage waveforms in accordance with one embodiment of the invention.

Referring to FIG. 3 with continuing reference to FIG. 2, FIG. 3 illustrates a primary excitation waveform 301 and corresponding secondary voltage waveforms 302, 303 in accordance with one embodiment of the invention. First and second enable pulses 304, 305 are provided by the excitation module 202 to the measurement module 204. The first and second enable pulses 304, 305 respectively correspond to the first and second phases 306, 307 that may indicate reference phases. The measurement module 204 measures and computes a positive sampled voltage 308 and a negative sampled voltage 309 at the first and second phases 306, 307 on secondary voltage waveform 302. After the measurement module 204 computes the positive sampled voltage 308 and the negative sampled voltage 309, the calculation module uses the sampled voltages to command the calibration module 208 to change subsequent phase values used by the measurement module 204. The calibration module 208 will increment a phase by a time shift value (Ts) to form a shifted first and second phases 310, 311. A shifted first phase 310 may be equal to the sum of a first phase 306 and the time shift value. A shifted second phase 311 may be equal to the sum of the second phase 307 and the time shift value. The time shift value (Ts) to may be the sampling time of an analog to digital converter.

After incrementing the phase, the calibration module 208 will generate shifted enable pulses 312, 313 with reference to the shifted first and second phases 310, 311. The measurement module will capture positive and negative shifted voltages 314, 315.

The calculation module compares the positive sampled voltage 308 with a shifted positive voltage 314. If the shifted positive voltage 314 is greater than the positive sampled voltage 308, the peak magnitude may be increasing. Thus, the calculation module 208 commands the calibration module 208 to increment first shifted phase 314.

If the shifted positive voltage 314 is less than the positive sampled voltage 308, the peak magnitude may be decreasing. Thus, the calculation module 208 commands the calibration module 208 to decrement the first shifted phase 314. Similar measurements and phase shifts are applied to the secondary voltage waveform 303.

Figure 4:
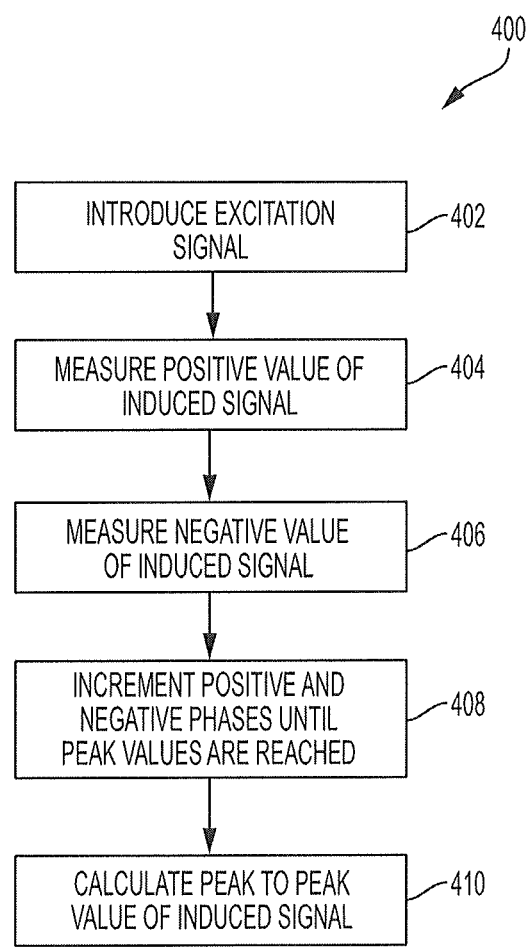
FIG. 4 is a block diagram of a self-calibrating demodulation technique in accordance with one embodiment of the subject invention.

FIG. 4 illustrates a method 400 in accordance with one embodiment of the subject invention. At step 402, an excitation signal is introduced to a primary coil of an LVDT. At step 404, a positive value of an induced signal is measured. The positive value is measured at a first phase, and the induced signal is caused by the excitation signal on a secondary coil of the LVDT. At step 406, a negative value of an induced signal is measured. The negative value is measured at a second phase. At step 408, the first phase and the second phase are incremented until a peak positive value and a peak negative value are measured. At step 410, the peak positive value and the peak negative value are used to calculate a peak-to-peak value of the induced signal.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A differential transformer comprising:
   a primary winding;
   first and secondary windings;
   a moveable shaft disposed between the primary winding and the first and second secondary windings;
   a measurement module that measures voltages on the first and second secondary windings;
   an excitation module that introduces an excitation signal to the primary winding, the excitation signal having a positive peak and a negative peak and induces a first signal on the first winding and induces a second signal on the second secondary winding, the excitation module generating a first enable pulse based on the positive peak that causes the measurement module to measure a voltage on the first second winding; and
   a calibration module that shifts the first enable pulse by a first phase shift until a peak value of the first signal is found to form a phase shifted first enable pulse;
   wherein, the excitation module generates the phase shifted first enable pulse to cause the measurement module to measure the induced signal in the first secondary winding.

2. The system of claim 1, a calculation module that determines a peak-to-peak value of the first signal based on the measurement of first signal when the measurement module received the phase shifter first enable pulse.

\* \* \* \* \*